United States Patent
Cho et al.

(10) Patent No.: US 11,360,615 B2
(45) Date of Patent: Jun. 14, 2022

(54) ELECTRONIC DEVICE HAVING TOUCH PANEL WITH MAIN SUBSIDIARY ELECTRODES

(71) Applicant: Samsung Display Co., Ltd., Yongin-si (KR)

(72) Inventors: Hyun-Wook Cho, Seongnam-si (KR); Min-Hong Kim, Hwaseong-si (KR); Taejoon Kim, Seongnam-si (KR); Jungmok Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/180,191

(22) Filed: Feb. 19, 2021

(65) Prior Publication Data

US 2021/0373703 A1  Dec. 2, 2021

(30) Foreign Application Priority Data

May 29, 2020  (KR) .......................... 10-2020-0065027

(51) Int. Cl.
    *G06F 3/044*      (2006.01)
    *G06F 3/041*      (2006.01)
    *H01L 27/32*      (2006.01)

(52) U.S. Cl.
    CPC .......... *G06F 3/0442* (2019.05); *G06F 3/0416* (2013.01); *G06F 3/0446* (2019.05); *H01L 27/323* (2013.01); *G06F 2203/04111* (2013.01)

(58) Field of Classification Search
    CPC .... G06F 3/0442; G06F 3/0446; G06F 3/0416; G06F 2203/04111; G06F 3/0448; G06F 3/03547; G06F 3/0445; G06F 3/0441; G06F 3/0346; G06F 3/03545; G06F 3/0443; H01L 27/323

See application file for complete search history.

(56) References Cited

U.S. PATENT DOCUMENTS

| | | | |
|---|---|---|---|
| 9,557,849 B2 | 1/2017 | Han et al. | |
| 9,632,379 B2 | 4/2017 | Kim et al. | |
| 10,331,237 B2 | 6/2019 | Nakamura | |
| 10,379,641 B2 | 8/2019 | Lim et al. | |
| 2013/0285945 A1* | 10/2013 | Oh | G06F 3/0443 200/600 |
| 2014/0327845 A1* | 11/2014 | Yashiro | G06F 3/0448 349/12 |

(Continued)

FOREIGN PATENT DOCUMENTS

| | | |
|---|---|---|
| JP | 4732376 B2 | 7/2011 |
| KR | 10-1085776 B1 | 11/2011 |

(Continued)

*Primary Examiner* — Richard J Hong
(74) *Attorney, Agent, or Firm* — Lewis Roca Rothgerber Christie LLP

(57) ABSTRACT

An electronic device may include a display panel, and an input sensor, in which a first region, a second region enclosing the first region, and a third region enclosing the second region are defined, on the display panel and including sensing electrodes including a first electrode including a first main electrode and a first subsidiary electrode, and a second electrode adjacent the first electrode, and including a second main electrode and a second subsidiary electrode between the first main electrode and the first subsidiary electrode in the first region.

18 Claims, 13 Drawing Sheets

(56) References Cited

U.S. PATENT DOCUMENTS

| | | | |
|---|---|---|---|
| 2015/0109254 A1* | 4/2015 | Han | G06F 3/0445 345/174 |
| 2015/0123942 A1* | 5/2015 | Huang | G06F 3/0445 345/174 |
| 2015/0153845 A1* | 6/2015 | Chang | G06F 3/0441 345/179 |
| 2015/0370369 A1* | 12/2015 | Kuo | G06F 3/0443 345/174 |
| 2020/0042113 A1* | 2/2020 | Chen | G06F 3/03547 |
| 2020/0401241 A1* | 12/2020 | Barel | G06F 3/0346 |
| 2021/0117047 A1 | 4/2021 | Cho | |
| 2021/0165504 A1* | 6/2021 | Trethewey | G06F 3/03545 |

FOREIGN PATENT DOCUMENTS

| | | |
|---|---|---|
| KR | 10-2018-0007388 A | 1/2018 |
| KR | 10-2082409 B1 | 2/2020 |

\* cited by examiner

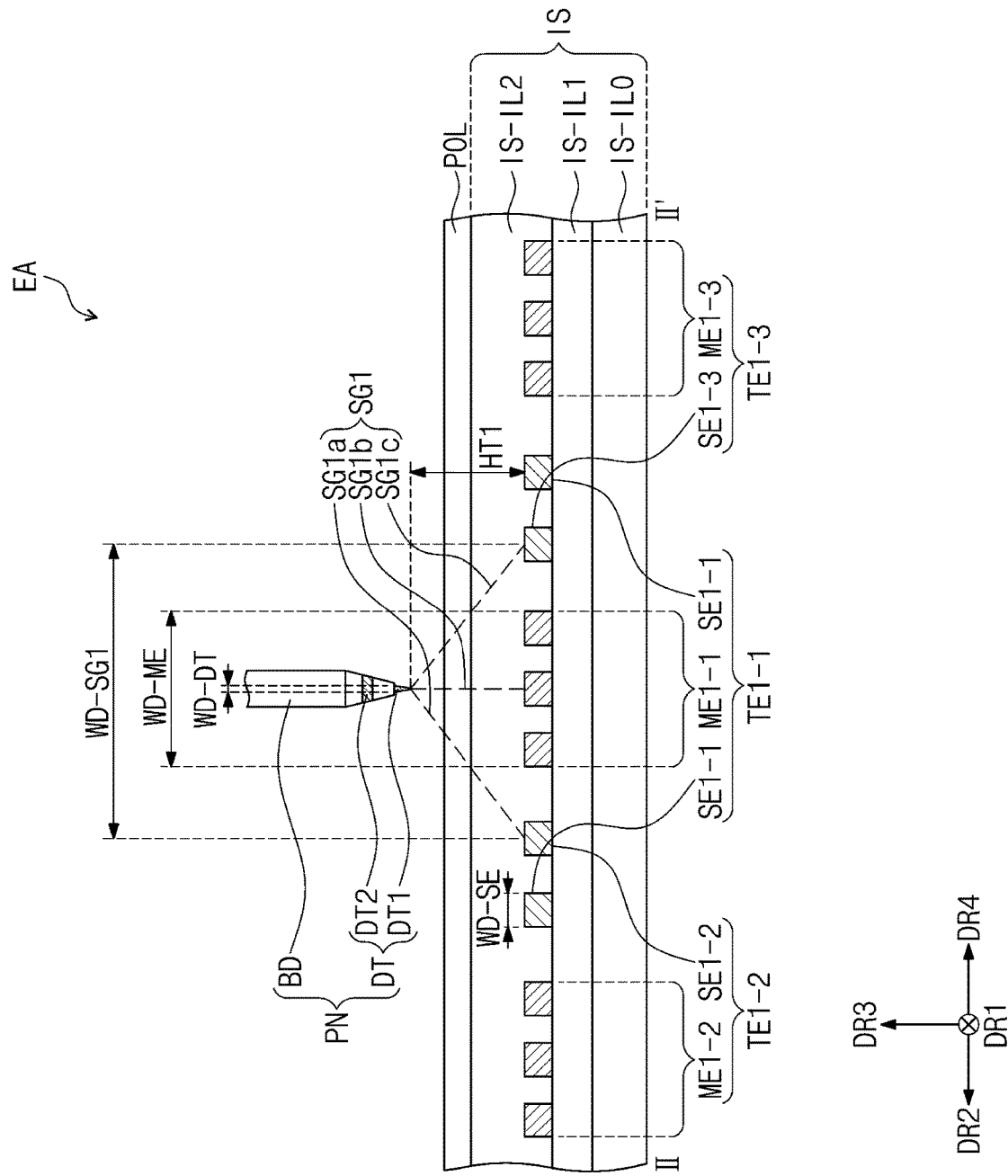

ELECTRONIC DEVICE HAVING TOUCH PANEL WITH MAIN SUBSIDIARY ELECTRODES

CROSS-REFERENCE TO RELATED APPLICATION

This application claims priority to, and the benefit of, Korean Patent Application No. 10-2020-0065027, filed on May 29, 2020, in the Korean Intellectual Property Office, the entire contents of which are hereby incorporated by reference.

BACKGROUND

1. Field

Embodiments of the present disclosure relate to an electronic device with improved sensing reliability.

2. Description of the Related Art

Electronic devices, such as smart phones, tablets, laptop computers, and smart television sets, are being developed. Such electronic device may include a display device that is used to provide information to a user.

Recently, electronic devices may include an input sensor, which is provided for an interaction with a user, in addition to a display panel displaying an image. The input sensor is configured to monitor whether there is a touch event between a screen and an object (e.g., a user's finger or a sensing pen), which occurs when the object is in contact with, or is moved toward, the screen, and to find coordinates of such a touch event. In certain cases, an image signal is input to the electronic device, based on the coordinates of the touch event.

SUMMARY

Some embodiments of the present disclosure provides an electronic device with improved sensing reliability.

According to some embodiments of the present disclosure, an electronic device may include a display panel, and an input sensor, in which a first region, a second region enclosing the first region, and a third region enclosing the second region are defined, on the display panel and including sensing electrodes including a first electrode including a first main electrode and a first subsidiary electrode, and a second electrode adjacent the first electrode, and including a second main electrode and a second subsidiary electrode between the first main electrode and the first subsidiary electrode in the first region.

The first subsidiary electrode and the second subsidiary electrode may cross each other in the second region in a plan view.

The display panel may include an active region and a peripheral region adjacent thereto, wherein the first region and the second region overlap the active region, and wherein the third region overlaps the peripheral region.

The display panel may include an active region and a peripheral region, which are defined in the display panel to be adjacent to each other, wherein the first region overlaps the active region, and wherein the second region and the third region overlap the peripheral region.

The input sensor may further include sensing lines in the third region that are electrically and respectively connected to the sensing electrodes, and that include a first line electrically connected to the first main electrode and to the first subsidiary electrode, and a second line electrically connected to the second main electrode and the second subsidiary electrode.

The sensing electrodes may further include a third electrode and a fourth electrode, which are adjacent to each other, wherein the first electrode and the second electrode extend in a first direction, wherein the third electrode and the fourth electrode extend in a second direction crossing the first direction, wherein the third electrode includes a third main electrode and a third subsidiary electrode, wherein the fourth electrode includes a fourth main electrode and a fourth subsidiary electrode, and wherein, in the second region, the fourth subsidiary electrode is between the third main electrode and the third subsidiary electrode.

A width of the first main electrode may be larger than a width of the first subsidiary electrode.

The first subsidiary electrode may include first subsidiary electrodes that are spaced apart from each other with the first main electrode therebetween.

The first electrode may further include a first auxiliary electrode that is spaced apart from the first main electrode with the first subsidiary electrode therebetween, wherein the second electrode further includes a second auxiliary electrode spaced apart from the second main electrode with the second subsidiary electrode therebetween, wherein, in the first region, the first subsidiary electrode and the first auxiliary electrode are between the second main electrode and the second subsidiary electrode, and wherein the first auxiliary electrode and the second auxiliary electrode cross each other in the second region, in a plan view.

The first electrode may further include at least one connection pattern in the first region that connects the first main electrode to the first subsidiary electrode, and that crosses the second subsidiary electrode, in a plan view.

In the first region, each of the first main electrode, the first subsidiary electrode, the second main electrode, and the second subsidiary electrode extend may in a first direction, wherein the first main electrode, the second subsidiary electrode, the first subsidiary electrode, and the second main electrode are sequentially located in a second direction crossing the first direction.

According to some embodiments of the present disclosure, an electronic device may include a display panel, in which an active region and a peripheral region are defined, and an input sensor on the display panel to sense a first signal caused by an active pen, including first sensing electrodes extending in a first direction and second sensing electrodes extending in a second direction crossing the first direction, and in which first, second, and third regions are defined, the second region enclosing the first region, and the third region enclosing the second region, wherein the first sensing electrodes include a first electrode including a first main electrode and a first subsidiary electrode, and a second electrode adjacent to the first electrode and including a second main electrode and a second subsidiary electrode, and wherein, in the first region, the first main electrode, the second subsidiary electrode, the first subsidiary electrode, and the second main electrode are sequentially located in the second direction.

The input sensor may be configured to sense a second signal, which is caused by the active pen and is different from the first signal, wherein the electronic device further includes a control unit that is configured to calculate an angle of the active pen relative to a top surface of the input sensor based on the first signal and the second signal.

The input sensor may be configured to be operated in an electrostatic capacitance manner in a first mode, wherein the input sensor is configured to be operated in a manner of sensing an electrostatic signal in a second mode, the first signal being recognized in the second mode.

A width of the first main electrode may be larger than a width of the first subsidiary electrode, wherein a width of the second main electrode is larger than a width of the second subsidiary electrode.

The first subsidiary electrode and the second subsidiary electrode may cross each other in the second region.

The second region may overlap the active region.

The second region may overlap the peripheral region.

The first electrode may further include a first auxiliary electrode, which is spaced apart from the first main electrode with the first subsidiary electrode therebetween, wherein the second electrode further includes a second auxiliary electrode, which is spaced apart from the second main electrode with the second subsidiary electrode therebetween, and wherein, in the first region, the first auxiliary electrode is between the second main electrode and the first subsidiary electrode, and the second auxiliary electrode is between the first main electrode and the second subsidiary electrode.

The first electrode may include connection patterns in the first region to connect the first main electrode to the first subsidiary electrode, wherein the connection patterns cross the second subsidiary electrode, in a plan view.

BRIEF DESCRIPTION OF THE DRAWINGS

Embodiments will be more clearly understood from the following brief description taken in conjunction with the accompanying drawings. The accompanying drawings represent non-limiting, embodiments as described herein.

FIG. 6A is a sectional view taken along the line II-II' of FIG. 4 to illustrate a portion of an electronic device according to some embodiments of the present disclosure.

Figure 1:
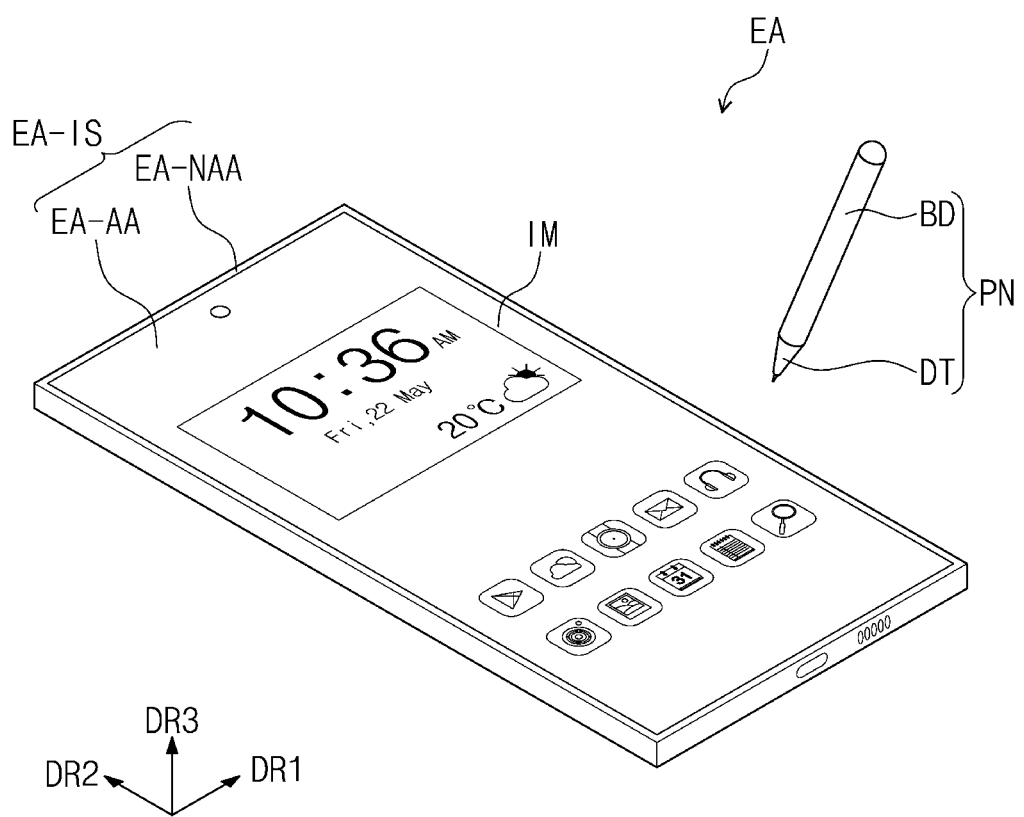
FIG. 1 is a perspective view illustrating an electronic device according to some embodiments of the present disclosure.

It should be noted that these figures are intended to illustrate the general characteristics of methods, structure and/or materials utilized in some embodiments and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating an electronic device according to some embodiments of the present disclosure.

Referring to FIG. 1, an electronic device EA may be activated by an electrical signal applied thereto. The electronic device EA may be implemented in various forms. For example, the electronic device EA may be used for large-sized electronic devices (e.g., television sets, monitors, and outdoor billboards) or small- or medium-sized electronic devices (e.g., personal computers, laptop computers, personal digital assistants, car navigation systems, game machines, portable electronic devices, smart phones, and cameras). However, these are merely examples of the present disclosure, and other electronic devices may be used to realize the present disclosure, as long as they do not depart from the present disclosure. For the sake of simplicity, the description that follows will refer to an example in which the electronic device EA is a smart phone.

The electronic device EA may include a display surface EA-IS, which is used to display an image IM. The display surface EA-IS may include an active region EA-AA and a peripheral region EA-NAA, which are adjacent to each other. The active region EA-AA may be a region on which the image IM is displayed. The peripheral region EA-NAA might not be used to display the image IM. The image IM may be a video image or a still image. FIG. 1 illustrates a clock and icons as an example of the image IM.

The active region EA-AA may be parallel to a surface defined by a first direction DR1 and a second direction DR2 crossing each other. A direction normal to the active region EA-AA (e.g., a thickness direction of the electronic device EA) will be referred to as a third direction DR3.

Hereinafter, a front or top surface and a back or bottom surface of each element or unit are differentiated based on the third direction DR3. The third direction DR3 may be a direction crossing both of the first and second directions DR1 and DR2. For example, the first direction DR1, the second direction DR2, and the third direction DR3 may be orthogonal to each other. In the present specification, a surface defined by the first direction DR1 and the second direction DR2 may be referred to as a "plane," and an expression of "when viewed in a plan view" may mean that an object to be described therein is seen in the third direction DR3.

The electronic device EA may sense sensing coordinates based on motion of an active pen PN. The active pen PN may include a body portion BD and a sensing portion DT, which is located at an end of the body portion BD. The body portion BD may include a power portion. The sensing portion DT may correspond to a conventional pen point. The sensing portion DT may be formed of, or may include, a conductive material. The sensing portion DT may produce an electric field between the sensing portion DT and a neighboring conductive object by using an electric power supplied from the power portion. The active pen PN may include an active electrostatic (AES) pen. The active pen PN will be described in more detail below.

Figure 2A:
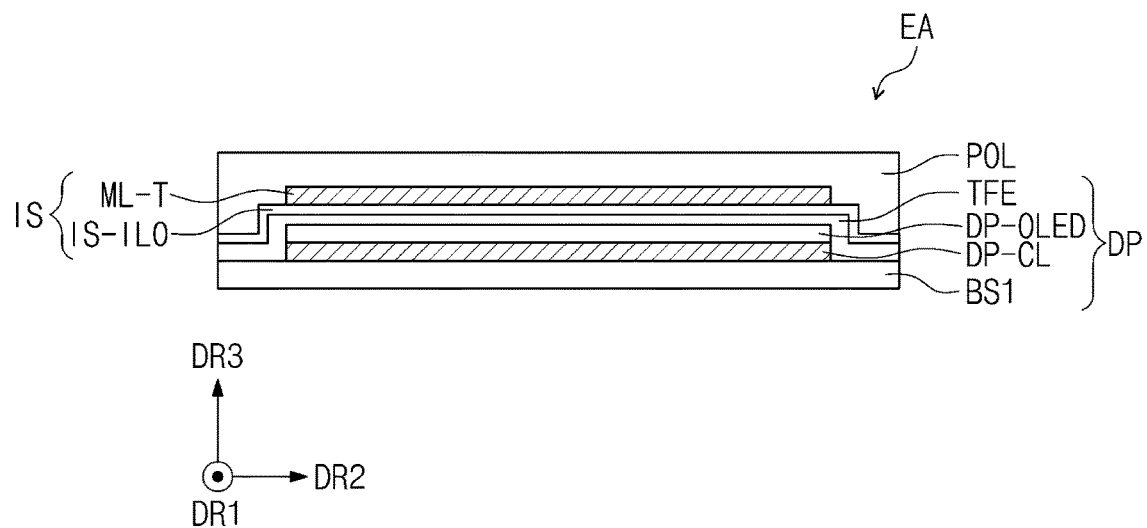
FIGS. 2A and 2B are sectional views illustrating an electronic device according to some embodiments of the present disclosure.

FIG. 2A is a sectional view illustrating an electronic device according to some embodiments of the present disclosure.

Referring to FIG. 2A, the electronic device EA may include a display panel DP, an input sensor IS, and an anti-reflection layer POL.

The display panel DP may include a first base layer BS1, a display circuit layer DP-CL, an image display layer DP-OLED, and a thin film encapsulation layer TFE.

The first base layer BS1 may be, or may include, a silicon substrate, a plastic substrate, a glass substrate, an insulating film, or a stack including a plurality of insulating layers.

The display circuit layer DP-CL may be located on the first base layer BS1. The display circuit layer DP-CL may include a plurality of insulating layers, a plurality of conductive layers, and at least one semiconductor layer. The conductive layers of the display circuit layer DP-CL may constitute signal lines or a pixel control circuit.

The image display layer DP-OLED may be located on the display circuit layer DP-CL. The image display layer DP-OLED may be a light-emitting type display layer, but the present disclosure is not limited to this example. For example, the image display layer DP-OLED may be an organic light emitting display layer, a quantum dot display layer, a nano-LED display layer, or a micro-LED display layer. The organic light emitting display layer may be formed of, or may include, an organic light emitting material. The quantum dot display layer may be formed of, or may include, quantum dots, quantum rods, or the like. The nano-LED display layer and the micro-LED display layer may include small LED devices of several hundreds of micrometers or smaller. For the sake of simplicity, the description that follows will refer to an example in which the image display layer DP-OLED is the organic light emitting display layer.

The thin film encapsulation layer TFE may be located on the image display layer DP-OLED to cover the image display layer DP-OLED. The thin film encapsulation layer TFE may include a first inorganic layer, an organic layer, and a second inorganic layer, which are sequentially stacked in the third direction DR3. However, the present disclosure is not limited to this structure of the thin film encapsulation layer TFE. For example, in some embodiments, the thin film encapsulation layer TFE may further include a plurality of inorganic layers and a plurality of organic layers.

The first inorganic layer may reduce or prevent penetration of external moisture or oxygen into the image display layer DP-OLED. For example, the first inorganic layer may be formed of, or may include, at least one of silicon nitride, silicon oxide, or compounds thereof.

The organic layer may be located on the first inorganic layer and may have a flat top surface. An uneven structure or a particle, which is formed on a top surface of the first inorganic layer, may be covered with the organic layer. The organic layer may be formed of, or may include, at least one of, for example, acrylic-based organic materials, but the present disclosure is not limited to this example.

The second inorganic layer may be located on the organic layer to cover the organic layer. The second inorganic layer may encapsulate or seal the organic layer, and thus, it may be possible to reduce or prevent leakage of moisture in the organic layer to the outside. The second inorganic layer may be formed of, or may include, at least one of silicon nitride, silicon oxide, or compounds thereof.

The input sensor IS may be formed on the display panel DP in a successive manner. In this case, the input sensor IS may be directly located on the display panel DP, meaning that no other element is located between the input sensor IS and the display panel DP. For example, there is no adhesive member between the input sensor IS and the display panel DP. However, the present disclosure is not limited to this example, and in some embodiments, the input sensor IS may be coupled to the display panel DP by an additional adhesive member.

The input sensor IS may include a base insulating layer IS-IL0 and a sensing circuit layer ML-T.

The base insulating layer IS-IL0 may be located on the thin film encapsulation layer TFE. The base insulating layer IS-IL0 may be formed of, or may include, at least one of inorganic materials, organic materials, or composite materials. The base insulating layer IS-IL0 may be directly located on the thin film encapsulation layer TFE. For example, the base insulating layer IS-IL0 may be in direct contact with the thin film encapsulation layer TFE. The base insulating layer IS-IL0 may have a single- or multi-layered structure. In some embodiments, the base insulating layer IS-IL0 may be omitted.

The sensing circuit layer ML-T may be located on the base insulating layer IS-IL0. The sensing circuit layer ML-T may include a plurality of insulating layers and a plurality of conductive layers. The conductive layers may include a plurality of sensing electrodes, which are used to sense an external input, and a plurality of sensing lines, which are electrically and respectively connected to the sensing electrodes, as will be described in more detail below.

The anti-reflection layer POL may be located on the input sensor IS. The anti-reflection layer POL may include a polarization layer. The anti-reflection layer POL may include a polarizer and a phase retarder. The polarizer and the phase retarder may be an elongation-type synthetic resin film or a coating-type synthetic resin film. For example, the anti-reflection layer POL may be provided by dyeing a polyvinylalcohol (PVA) film with an iodine compound. The anti-reflection layer POL may be configured to reduce an optical reflectance of an external light that is incident from the outside.

In some embodiments, the anti-reflection layer POL may include color filters. In some embodiments, the color filters may be arranged in a specific or particular manner. The arrangement of the color filters may be determined in consideration of colors of lights to be emitted from pixels in the image display layer DP-OLED.

In some embodiments, the anti-reflection layer POL may include a destructive interference structure. For example, the destructive interference structure may include a first reflection layer and a second reflection layer, which are located at different layers. First and second reflection lights, which are respectively reflected by the first and second reflection layers, may destructively interfere with each other, and thus, the reflectance of the external light may be reduced.

Figure 2B:
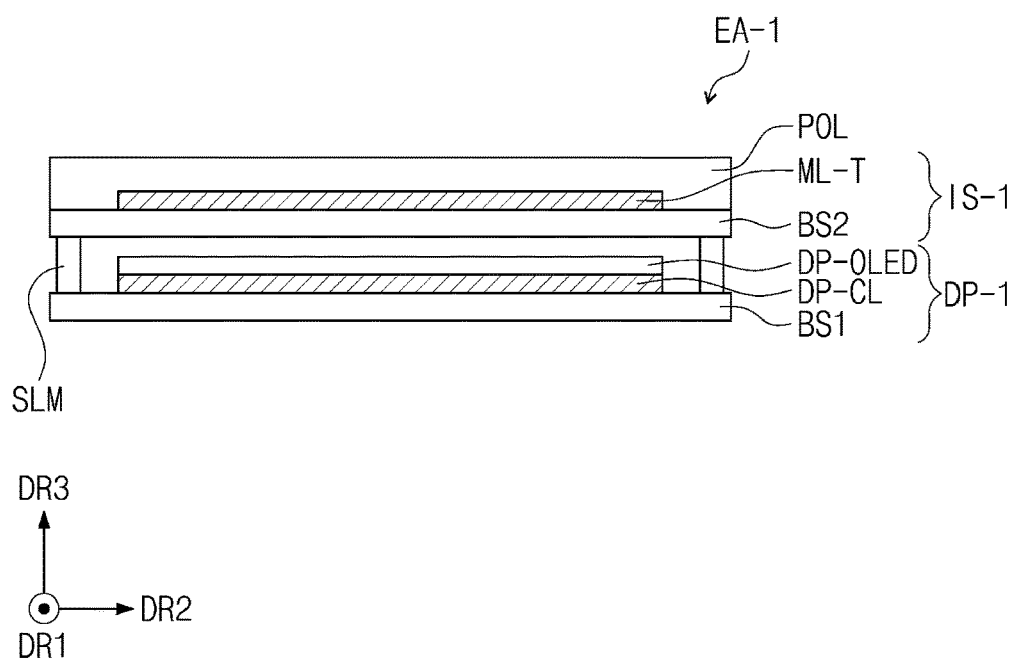

FIG. 2B is a sectional view illustrating an electronic device according to some embodiments of the present disclosure. In the following description of FIG. 2B, an element described with reference to FIG. 2A may be identified by a similar or identical reference number, without repeating an overlapping description thereof, for the sake of brevity.

Referring to FIG. 2B, an electronic device EA-1 may include a display panel DP-1, an input sensor IS-1, and the anti-reflection layer POL.

The display panel DP-1 may include the first base layer BS1, the display circuit layer DP-CL, and the image display layer DP-OLED.

The input sensor IS-1 may be located on the display panel DP-1. The input sensor IS-1 may include a second base layer BS2 and the sensing circuit layer ML-T.

The second base layer BS2 may be, or may include, a silicon substrate, a plastic substrate, a glass substrate, an insulating film, or a stack including a plurality of insulating layers.

A coupling member SLM may be located between the first base layer BS1 and the second base layer BS2. The coupling member SLM may be combined with the first base layer BS1 and the second base layer BS2. The coupling member SLM may be formed of, or may include, at least one of organic materials (e.g., photo-curing or photo-plastic resins) or inorganic materials (e.g., frit seal), but the present disclosure is not limited to these examples or a specific embodiment.

Figure 3:
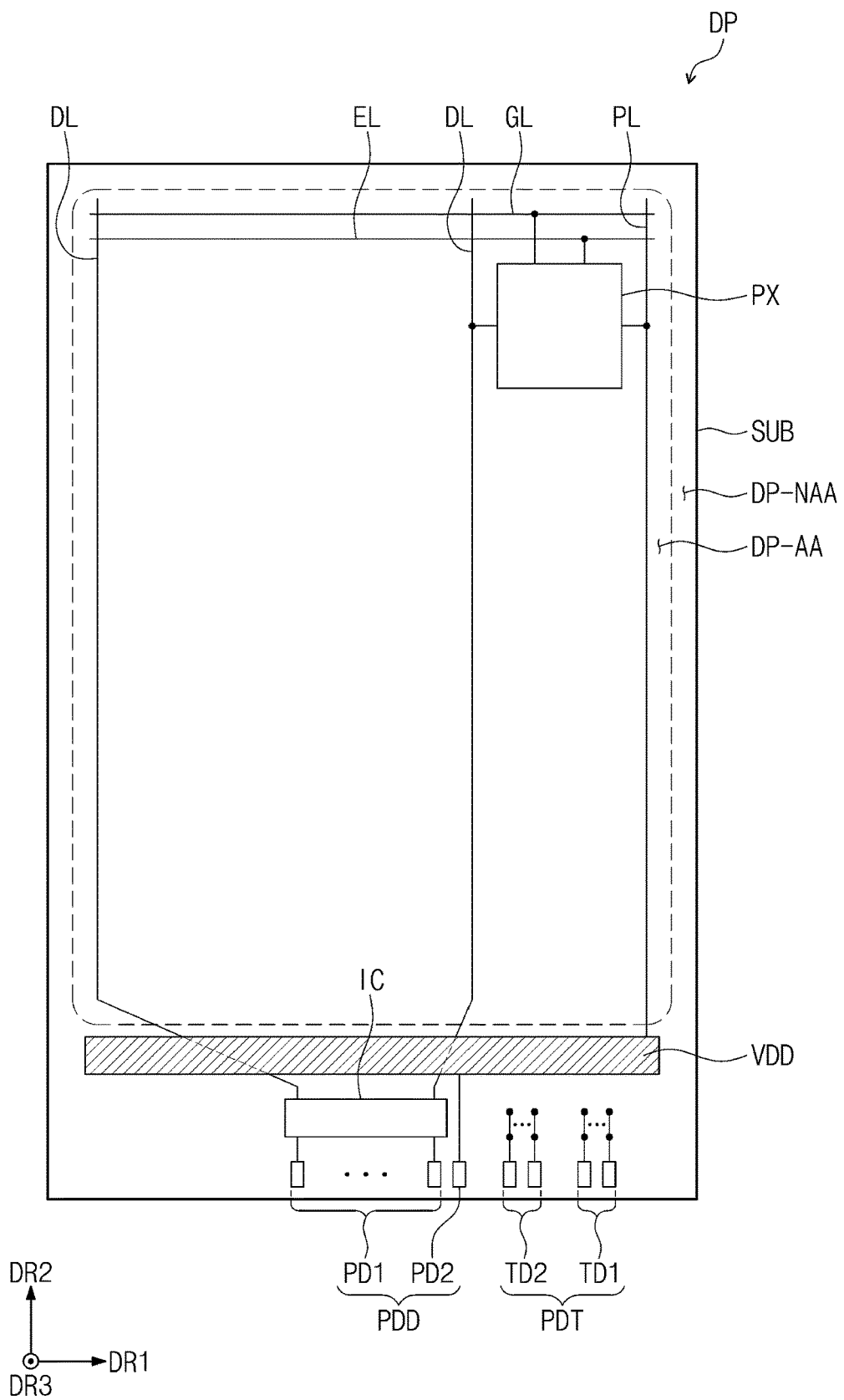
FIG. 3 is a plan view illustrating a display panel according to some embodiments of the present disclosure.

FIG. 3 is a plan view illustrating a display panel according to some embodiments of the present disclosure.

Referring to FIG. 3, an active region DP-AA and a peripheral region DP-NAA, which are adjacent to each other, may be defined in the display panel DP. The active region DP-AA may be a region, which is used to display the image IM (e.g., see FIG. 1). A plurality of pixels PX may be located in the active region DP-AA. The active region DP-AA may correspond to the active region EA-AA of the electronic device EA (e.g., see FIG. 1). The peripheral region DP-NAA may be a region, in which a driving circuit or driving lines are located. The peripheral region DP-NAA may correspond to the peripheral region EA-NAA of the electronic device EA (e.g., see FIG. 1).

Each of the pixels PX may be configured to display one of primary colors or one of mixed colors. The primary colors may include red, green, and blue colors. The mixed colors may include various colors, such as white, yellow, cyan, and magenta. However, the colors that can be displayed by the pixels PX are not limited to the above colors.

The display panel DP may include a base layer BS1, a plurality of pixels PX, a plurality of signal lines GL, DL, PL, and EL, a plurality of display pads PDD, and a plurality of sensing pads PDT.

The signal lines GL, DL, PL, and EL may be located on the base layer BS1. The base layer BS1 may be the first base layer BS1 of FIG. 2A. The signal lines GL, DL, PL, and EL may be connected to the pixels PX to deliver electrical signals to the pixels PX. The signal lines GL, DL, PL, and EL may include a plurality of scan lines GL, a plurality of data lines DL, a plurality of power lines PL, and a plurality of light-emitting control lines EL. However, the present disclosure is not limited to the described structure of the signal lines GL, DL, PL, and EL. For example, the signal lines GL, DL, PL, and EL may further include at least one initialization voltage line.

A power pattern VDD may be located in the peripheral region DP-NAA. The power pattern VDD may be coupled to the power lines PL. Because the display panel DP includes the power pattern VDD, the same power signal may be provided to the pixels PX.

The display pads PDD may be located in the peripheral region DP-NAA. The display pads PDD may include a first pad PD1 and a second pad PD2. In some embodiments, a plurality of first pads PD1 may be provided. The first pads PD1 may be electrically and respectively connected to the data lines DL. The second pad PD2 may be electrically connected to the power lines PL through the power pattern VDD. The display panel DP may provide electrical signals, which are externally provided, to the pixels PX via the display pads PDD. In some embodiments, the display pads PDD may further include pads, which are used to receive other electrical signals, in addition to the first and second pads PD1 and PD2, but the present disclosure is not limited to this example or any specific embodiment.

A driving chip IC may be mounted on the peripheral region DP-NAA. The driving chip IC may be a timing control circuit, which is provided in the form of a chip. The data lines DL may be electrically connected to the first pads PD1, respectively, through the driving chip IC. However, the present disclosure is not limited to this example, and in some embodiments, the driving chip IC may be mounted on a film that is distinct from the display panel DP. In this case, the driving chip IC may be electrically connected to the display pads PDD through the film.

The sensing pads PDT may be located in the peripheral region DP-NAA. The sensing pads PDT may be electrically and respectively connected to a plurality of sensing electrodes, which are provided in the input sensor IS (e.g., see FIG. 2A) and will be described below. The sensing pads PDT may include a plurality of first sensing pads TD1 and a plurality of second sensing pads TD2.

Figure 4:
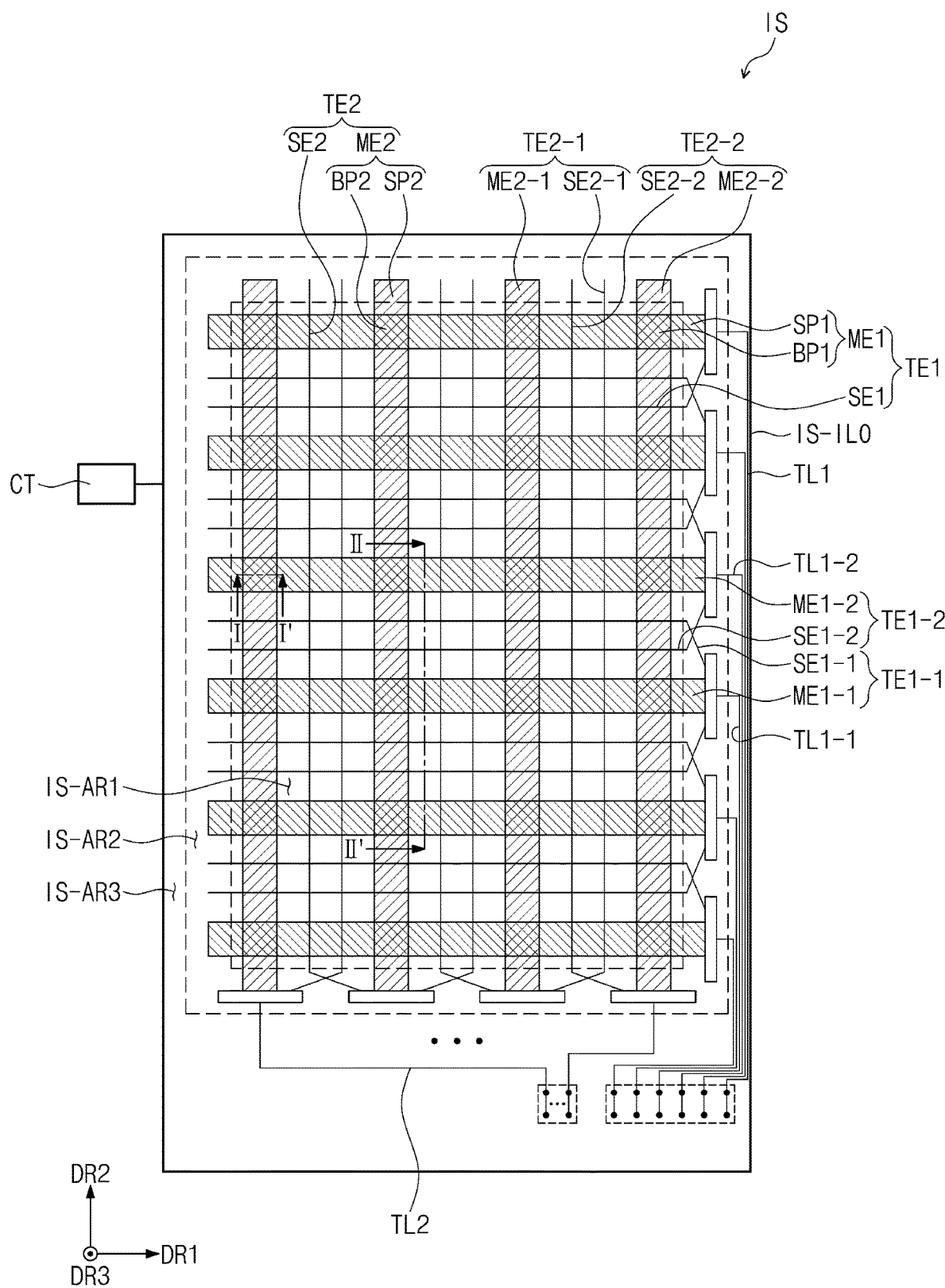
FIG. 4 is a plan view schematically illustrating an input sensor according to some embodiments of the present disclosure.
Figure 5:
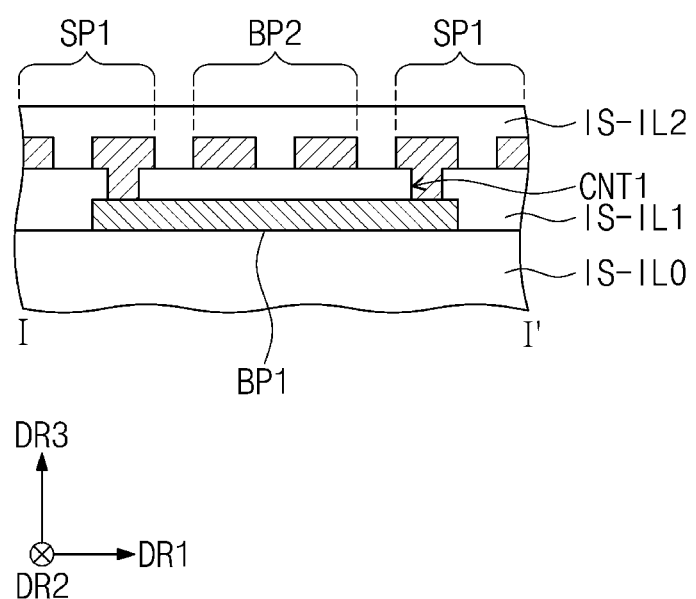
FIG. 5 is a sectional view taken along the line I-I' of FIG. 4.

FIG. 4 is a plan view schematically illustrating an input sensor according to some embodiments of the present disclosure, and FIG. 5 is a sectional view taken along the line I-I' of FIG. 4.

Referring to FIGS. 4 and 5, a first region IS-AR1, a second region IS-AR2, and a third region IS-AR3 may be defined in the input sensor IS. The second region IS-AR2 may enclose the first region IS-AR1. The third region IS-AR3 may enclose the second region IS-AR2. The second region IS-AR2 may be located between the first region IS-AR1 and the third region IS-AR3. The first region IS-AR1 may be overlapped with the active region DP-AA of the display panel DP (e.g., see FIG. 3). The third region IS-AR3 may be overlapped with the peripheral region DP-NAA of the display panel DP (e.g., see FIG. 3).

In some embodiments, the second region IS-AR2 may be overlapped with the active region DP-AA of the display panel DP (e.g., see FIG. 3). However, the present disclosure is not limited to this overlapping structure of the second region IS-AR2. For example, the second region IS-AR2 may be overlapped with the peripheral region DP-NAA of the display panel DP (e.g., see FIG. 3).

The input sensor IS may include the base insulating layer IS-IL0, a plurality of sensing electrodes TE1 and TE2, and a plurality of sensing lines TL1 and TL2.

The sensing electrodes TE1 and TE2 may be located in the first region IS-AR1 and the second region IS-AR2. The sensing electrodes TE1 and TE2 may include a plurality of first sensing electrodes TE1 and a plurality of second sensing electrodes TE2.

Each of the first sensing electrodes TE1 may extend in the first direction DR1. The first sensing electrodes TE1 may be arranged to be spaced apart from each other in the second direction DR2. Each of the first sensing electrodes TE1 may include a main electrode ME1 and a subsidiary electrode SE1. For example, each of the first sensing electrodes TE1 may include one main electrode ME1 and two subsidiary electrodes SE1, which are spaced apart from each other with the main electrode ME1 interposed therebetween.

The main electrode ME1 may include a plurality of sensing patterns SP1 and a plurality of bridge patterns BP1. The sensing patterns SP1 may be referred to as first sensing patterns SP1.

One of the first sensing electrodes TE1 may be referred to as a first electrode TE1 Another of the first sensing electrodes TE1 adjacent to the first electrode TE1-1 may be referred to as a second electrode TE1-2. The main electrode of the first electrode TE1 may be referred to as a first main electrode ME1-1, and the subsidiary electrode of the first electrode TE1 may be referred to as a first subsidiary electrode SE1-1. The main electrode of the second electrode TE1 may be referred to as a second main electrode ME1-2, and the subsidiary electrode of the second electrode TE1-2 may be referred to as a second subsidiary electrode SE1-2.

In the first region IS-AR1, the first main electrode ME1-1 and the first subsidiary electrode SE1-1 may be spaced apart from each other, with the second subsidiary electrode SE1-2 interposed therebetween. The second main electrode ME1-2 and the second subsidiary electrode SE1-2 may be spaced apart from each other, with the first subsidiary electrode SE1-1 interposed therebetween.

When viewed in a plan view, the first subsidiary electrode SE1-1 and the second subsidiary electrode SE1-2 may cross each other in the second region IS-AR2.

In the first region IS-AR1, the first main electrode ME1-1, the second subsidiary electrode SE1-2, the first subsidiary electrode SE1-1, and the second main electrode ME1-2 may be sequentially arranged in the second direction DR2.

Each of the second sensing electrodes TE2 may extend in the second direction DR2. The second sensing electrodes TE2 may be arranged to be spaced apart from each other in the first direction DR1. Each of the second sensing electrodes TE2 may include a main electrode ME2 and a subsidiary electrode SE2. For example, each of the second sensing electrodes TE2 may include one main electrode ME2 and two subsidiary electrodes SE2, which are spaced apart from each other with the main electrode ME2 interposed therebetween.

The main electrode ME2 may include a plurality of first portions SP2 and a plurality of second portions BP2. The first portions SP2 may be referred to as second sensing patterns.

One of the second sensing electrodes TE2 may be referred to as a third electrode TE2-1. Another of the second sensing electrodes TE2 adjacent to the third electrode TE2-1 may be referred to as a fourth electrode TE2-2. The main electrode of the third electrode TE2-1 may be referred to as a third main electrode ME2-1, and the subsidiary electrode of the third electrode TE2-1 may be referred to as a third subsidiary electrode SE2-1. The main electrode of the fourth electrode TE2-2 may be referred to as a fourth main electrode ME2-2, and the subsidiary electrode of the fourth electrode TE2-2 may be referred to as a fourth subsidiary electrode SE2-2.

In the first region IS-AR1, the third main electrode ME2-1 and the third subsidiary electrode SE2-1 may be spaced apart from each other, with the fourth subsidiary electrode SE2-2 interposed therebetween. The fourth main electrode ME2-2 and the fourth subsidiary electrode SE2-2 may be spaced apart from each other, with the third subsidiary electrode SE2-1 interposed therebetween.

When viewed in a plan view, the third subsidiary electrode SE2-1 and the fourth subsidiary electrode SE2-2 may cross each other in the second region IS-AR2.

In the first region IS-AR1, the third main electrode ME2-1, the fourth subsidiary electrode SE2-2, the third subsidiary electrode SE2-1, and the fourth main electrode ME2-2 may be sequentially located in the first direction DR1.

The bridge patterns BP1 and the second portions BP2 may be located on different layers. The second portions BP2 may cross the first sensing electrodes TE1 in an electrically disconnected manner. For example, the second portions BP2 may cross each of the bridge patterns BP1 in the electrically disconnected manner.

The bridge patterns BP1 may be located on the base insulating layer IS-IL0. A first insulating layer IS-IL1 may be located on the bridge patterns BP1. The first insulating layer IS-IL1 may cover the bridge patterns BP1. The first insulating layer IS-IL1 may be formed of, or may include, at least one of inorganic, organic, or composite materials. The bridge patterns BP1 may have a mesh structure.

The sensing patterns SP1, the first portions SP2, and the second portions BP2 may be located on the first insulating layer IS-IL1. The sensing patterns SP1, the first portions SP2, and the second portions BP2 may have a mesh structure.

A plurality of contact holes CNT1 may be provided to penetrate the first insulating layer IS-IL1 in the third direction DR3. Two adjacent ones of the sensing patterns SP1 may be electrically connected to the bridge pattern BP1 through respective contact holes CNT1.

A second insulating layer IS-IL2 may be located on the sensing patterns SP1, the first portions SP2, and the second portions BP2. The second insulating layer IS-IL2 may cover the sensing patterns SP1, the first portions SP2, and the second portions BP2. The second insulating layer IS-IL2 may be formed of, or may include, at least one of inorganic, organic, or composite materials.

FIG. 5 illustrates a bottom bridge structure, in which the bridge patterns BP1 are located below the sensing patterns SP1, the first portions SP2, and the second portions BP2, but the structure of the input sensor IS is not limited thereto. For example, in some embodiments, the input sensor IS may have a top bridge structure, in which the bridge patterns BP1 are located above the sensing patterns SP1, the first portions SP2, and the second portions BP2.

The sensing lines TL1 and TL2 may be located in the third region IS-AR3. The sensing lines TL1 and TL2 may include a plurality of first sensing lines TL1 and a plurality of second sensing lines TL2. The first sensing lines TL1 may be electrically connected to the first sensing electrodes TE1, respectively. Each of the first sensing lines TL1 may be electrically connected to the main electrode ME1 and the subsidiary electrode SE1. The second sensing lines TL2 may be electrically connected to the second sensing electrodes TE2, respectively. Each of the second sensing lines TL2 may be electrically connected to the main electrode ME2 and the subsidiary electrode SE2.

The first sensing lines TL1 may include a first line TL1-1 and a second line TL1-2. The first main electrode ME1-1 and the first subsidiary electrode SE1-1 may be electrically connected to the first line TL1-1. The second main electrode ME1-2 and the second subsidiary electrode SE1-2 may be electrically connected to the second line TL1-2.

The first sensing pads TD1 (e.g., see FIG. 3) may be electrically connected to the first sensing lines TL1, respectively, through contact holes. The second sensing pads TD2 (e.g., see FIG. 3) may be electrically connected to the second sensing lines TL2, respectively, through contact holes.

The electronic device EA (e.g., see FIG. 1) may further include a control unit CT, which controls the input sensor IS. An operation mode of the input sensor IS may be alternately switched to a first mode or a second mode under the control of the control unit CT.

The first mode may be a touch mode for detecting an input, which may be provided through a portion of a user's body. In the first mode, the first sensing electrodes TE1 may output a sensing signal, and the second sensing electrodes TE2 may receive a driving signal. Here, the electronic device EA may apply the driving signal to the second sensing electrodes TE2 to scan the first region IS-AR1 and may sense a region to which a touch is applied by using the sensing signal output from the first sensing electrodes TE1. For example, when the input sensor IS is in the first mode, the input sensor IS may be operated in an electrostatic capacitance manner.

However, the present disclosure is not limited to this example. For example, in some embodiments, the first sensing electrodes TE1 may be configured to receive the driving signal, and the second sensing electrodes TE2 may be configured to output the sensing signal. Alternatively, at least one of the first and second sensing electrodes TE1 and TE2 may be configured to output or receive other additional electrical signals.

The second mode may be different from the first mode. The second mode may be a pen mode for detecting the active pen PN. In the second mode, the same sensing signal may be provided to the first and second sensing electrodes TE1 and TE2.

The input sensor IS may detect a change amount in voltage and/or current of the sensing signal provided to the first and second sensing electrodes TE1 and TE2. The input sensor IS may calculate sensing coordinates, based on the change amount in voltage and/or current. For example, when the input sensor IS is in the second mode, the input sensor IS may be operated in a manner of sensing a driving signal to be input from the outside (e.g., the active electrostatic (AES) pen).

According to some embodiments of the present disclosure, in the second mode, as the active pen PN is in contact with, or is moved toward, the input sensor IS, the sensing coordinates may be calculated by the control unit CT of the input sensor IS. If the sensing portion DT of the active pen PN is in contact with, or is moved toward, the input sensor IS, an electric field between the sensing portion DT and the sensing electrodes TE1 and TE2 may be changed.

A magnitude of a voltage provided to the sensing portion DT may be different from a magnitude of a voltage provided to the sensing electrodes TE1 and TE2. Thus, the movement of the active pen PN may lead to a change in electric potential between the sensing portion DT and the sensing electrodes TE1 and TE2. Due to such a change in the electric potential, there may be a change in electric field between the sensing portion DT and the sensing electrodes TE1 and TE2. This change of the electric field may cause a change in electrostatic capacitance between the sensing electrodes TE1 and TE2, which is detected by the control unit CT and is used to calculate position coordinates of the active pen.

Figure 6B:
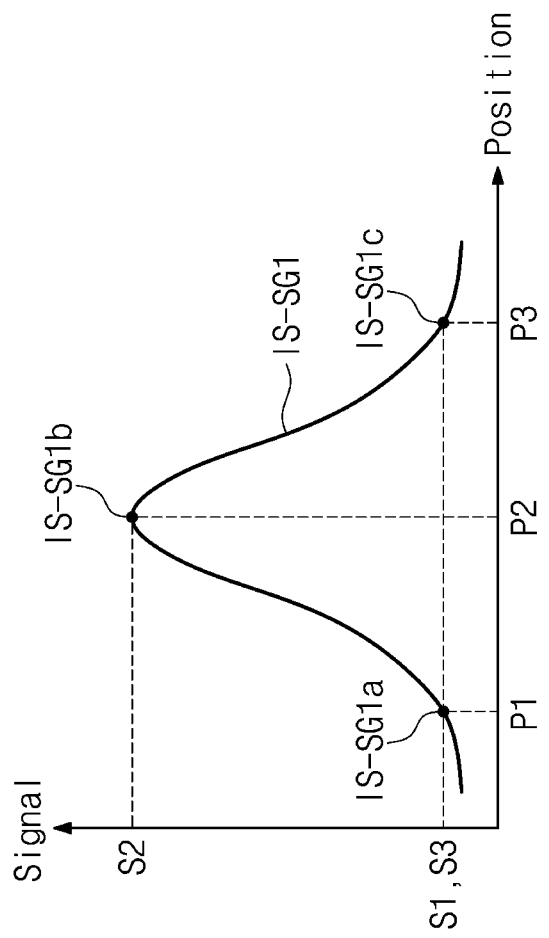
FIG. 6B is a graph showing a signal of an input sensor receiving a first signal, according to some embodiments of the present disclosure.

FIG. 6A is a sectional view taken along the line II-II' of FIG. 4 to illustrate a portion of an electronic device according to some embodiments of the present disclosure, and FIG. 6B is a graph showing a signal of an input sensor receiving a first signal, according to some embodiments of the present disclosure. In the following description of FIG. 6A, an element described with reference to FIGS. 4 and 5 may be identified by a similar or identical reference number without repeating an overlapping description thereof for the sake of brevity.

Referring to FIGS. 6A and 6B, the anti-reflection layer POL may be located on the input sensor IS. The active pen PN may be located on the anti-reflection layer POL to transmit a first signal SG1.

The sensing portion DT may include a first pen electrode DT1 and a second pen electrode DT2. The first pen electrode DT1 may be placed at an end of the active pen PN. The second pen electrode DT2 may be placed on a side surface of the body portion BD. The second pen electrode DT2 will be described in more detail below.

The first sensing electrodes TE1 may include an electrode, which will also be referred to as a second electrode TE1-3, and which is adjacent to the first electrode TE1 and is spaced apart from the second electrode TE1 in the second direction DR2 with the first electrode TE1-1 interposed therebetween. The main electrode of the second electrode TE1-3 may also be referred to as a second main electrode ME1-3. The subsidiary electrode of the second electrode TE1-3 may also be referred to as a second subsidiary electrode SE1-3.

The first electrode TE1-1 and the second electrodes TE1-2 and TE1-3, which are adjacent to the first electrode TE1 may have a mesh structure.

A width WD-ME of the first main electrode ME1-1 may be larger than a width WD-SE of the first subsidiary electrode SE1-1.

The first pen electrode DT1 may transmit the first signal SG1. The first signal SG1 may have a first frequency. The first frequency may range from about 100 kHz to about 140 kHz. In some embodiments, the first frequency may be about 120 kHz. The first signal SG1 may be used to cause a change in the electric field. The control unit CT may obtain a sensing signal IS-SG1 having a Gaussian intensity distribution from calculation based on the change of the electric field measured by the sensing electrodes TE1 and TE2.

The first signal SG1 may include a first sub-signal SG1$a$, a second sub-signal SG1$b$, and a third sub-signal SG1$c$. The first sub-signal SG1$a$, the second sub-signal SG1$b$, and the third sub-signal SG1$c$ may be classified by an emission angle of the first signal SG1.

The second subsidiary electrode SE1-2 may be used to sense the first sub-signal SG1$a$. The first main electrode ME1-1 may be used to sense the second sub-signal SG1$b$. The other second subsidiary electrode SE1-3 may be used to sense the third sub-signal SG1$c$.

The control unit CT (e.g., see FIG. 4) may calculate a first intensity S1 of a first sensing signal IS-SG1$a$ at a position P1 of the second electrode TE1 from the first sub-signal SG1$a$ sensed by the second subsidiary electrode SE1-2. The control unit CT (e.g., see FIG. 4) may calculate a second intensity S2 of a second sensing signal IS-SG1$b$ at a position P2 of the first electrode TE1 from the second sub-signal SG1$b$ sensed by the first main electrode ME1-1. The control unit CT (e.g., see FIG. 4) may calculate a third intensity S3 of a third sensing signal IS-SG1$c$ at a position P3 of the other second electrode TE1-3 from the third sub-signal SG1$c$ sensed by the other second subsidiary electrode SE1-3.

In the control unit CT (e.g., see FIG. 4), the first sensing signal IS-SG1$a$, the second sensing signal IS-SG1$b$, and the third sensing signal IS-SG1$c$ may be combined to form the sensing signal IS-SG1. The control unit CT (e.g., see FIG. 4) may calculate position coordinates of the active pen PN with improved accuracy, from the sensing signal IS-SG1. FIG. 6B illustrates an example in which the first intensity S1 is equal to the third intensity S3, but depending on the position of the active pen PN, the first intensity S1 and the third intensity S3 may be recognized as different intensities.

For example, if the first intensity S1 of the first sensing signal IS-SG1$a$ is different from the third intensity S3 of the third sensing signal IS-SG1$c$, the first intensity S1 and the third intensity S3 may be compared to more accurately calculate the position of the active pen PN. If the first intensity S1 is greater than the third intensity S3, the control unit CT (e.g., see FIG. 4) may obtain coordinates of the active pen PN corresponding to a position that is moved from the center of the first main electrode ME1-1 in the second direction DR2. If the first intensity S1 is less than the third intensity S3, the control unit CT (e.g., see FIG. 4) may obtain coordinates of the active pen PN corresponding to a position that is moved from the center of the first main electrode ME1-1 in a fourth direction DR4, which is opposite to the second direction DR2.

According to some embodiments of the present disclosure, each of the second subsidiary electrodes SE1-2 and SE1-3 may be located between the first main electrode ME1-1 and one of the first subsidiary electrodes SE1-1, respectively. The second subsidiary electrodes SE1-2 and SE1-3 may be located adjacent to the first main electrode ME1-1. The second subsidiary electrodes SE1-2 and SE1-3 may be used to sense the first signal SG1 or a portion thereof. The control unit CT (e.g., see FIG. 4) may correct position coordinates of the active pen PN, using the first sensing signal IS-SG1$a$ and the third sensing signal IS-SG1$c$. Accordingly, it may be possible to improve the accuracy in position coordinates of the active pen PN relative to the electronic device EA by using the first signal SG1. This may make it possible to provide the electronic device EA with improved sensing reliability.

An effective width WD-SG1 of the electric field of the first signal SG1 may be determined by a width WD-DT of the first pen electrode DT1 and/or a distance HT1 between the first pen electrode DT1 and the sensing electrodes TE1 and TE2 (e.g., a distance HT1 in the third direction DR3). The effective width WD-SG1 of the electric field may be a distance between points, at which the first and third subsignals SG1a and SG1c meet the sensing electrodes TE1 and TE2 (e.g., see FIG. 4), respectively. If the width WD-DT of the first pen electrode DT1 is decreased to reduce a size of the active pen PN, the effective width WD-SG1 of the electric field of the first signal SG1 may be reduced. If the distance HT1 between the first pen electrode DT1 and the sensing electrodes TE1 and TE2 (e.g., see FIG. 4) is decreased (e.g., by reducing a thickness or size of the electronic device EA), an intensity of the first signal SG1 may be increased, and the effective width WD-SG1 of the electric field of the first signal SG1 may be reduced.

If, unlike embodiments of the present disclosure, each of the second subsidiary electrodes SE1-2 and SE1-3 is not located between the first main electrode ME1-1 and the first subsidiary electrode SE1-1, the reduction in the width WD-DT and the distance HT1 may lead to a reduction of the effective width WD-SG1 of the electric field, and in this case, it may be difficult to detect the first signal SG1 at the second electrodes TE1-2 and TE1-3 adjacent to the first electrode TE1-1, or it may be difficult to correct the coordinates with high accuracy. In this case, a straight line, which is input by the active pen PN, may be recognized as a zigzag shape.

Contrastingly, in the electronic device EA according to some embodiments of the present disclosure, the number of the sensing electrodes may be unchanged, each sensing electrode may be divided into a main electrode and a subsidiary electrode, and each of the second subsidiary electrodes SE1-2 and SE1-3 may be located between the first main electrode ME1-1 and a respective first subsidiary electrode SE1-1. Even when the width WD-DT or the distance HT1 is reduced, the first signal SG1 may be detected by the second subsidiary electrodes SE1-2 and SE1-3 located between the first main electrode ME1-1 and the first subsidiary electrode SE1-1. In the control unit CT (e.g., see FIG. 4), position coordinates of the active pen PN may be corrected using the first sensing signal IS-SG1a and the third sensing signal IS-SG1c. It may be possible to improve the accuracy in position coordinates of the active pen PN relative to the electronic device EA by using the first signal SG1. This may make it possible to provide the electronic device EA with improved sensing reliability.

Figure 6C:
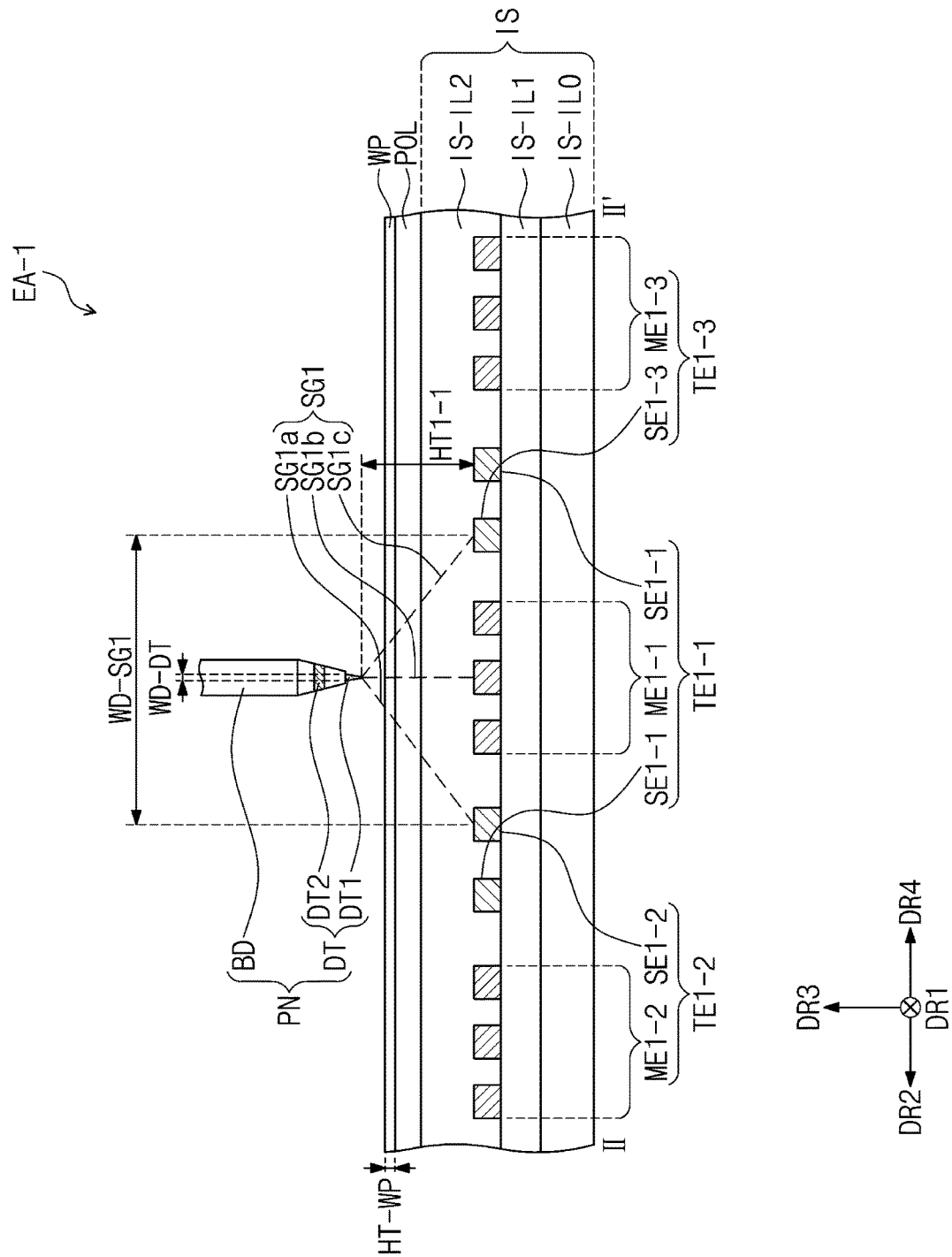
FIG. 6C is a sectional view taken along the line II-II' of FIG. 4 to illustrate a portion of an electronic device according to some embodiments of the present disclosure.

FIG. 6C is a sectional view taken along the line II-II' of FIG. 4 to illustrate a portion of an electronic device according to some embodiments of the present disclosure. In the following description of FIG. 6C, an element described with reference to FIG. 6A may be identified by a similar or identical reference number without repeating an overlapping description thereof, for the sake of brevity.

Referring to FIG. 6C, the electronic device EA-1 may further include a window WP. The window WP may be located on the anti-reflection layer POL. The window WP may be formed of, or may include, an optically transparent insulating material. For example, the window WP may be formed of, or may include, at least one of glass or plastic materials. The window WP may have a multi- or single-layered structure. For example, the window WP may include a plurality of plastic films, which are combined to each other by an adhesive material, or a glass substrate and a plastic film, which are combined to each other by an adhesive material.

In some embodiments, the window WP may be a thin plate that has a thickness HT-WP of about 0.5 mm or thinner. Due to this small thickness of the window WP, a thickness of the electronic device EA-1 may be reduced. A distance HT1-1 between the first pen electrode DT1 and the sensing electrodes TE1 and TE2 (e.g., see FIG. 4) may be reduced. The effective width WD-SG1 of the electric field of the first signal SG1 may be reduced. According to some embodiments of the present disclosure, each of the second subsidiary electrodes SE1-2 and SE1-3 may be located between the first main electrode ME1-1 and a respective one of the first subsidiary electrodes SE1-1. The control unit CT (e.g., see FIG. 4) may correct the position coordinates of the active pen PN using signals sensed by the second subsidiary electrodes SE1-2 and SE1-3. It may be possible to improve the accuracy in position coordinates of the active pen PN relative to the electronic device EA-1 by using the first signal SG1. This may make it possible to provide the electronic device EA-1 with improved sensing reliability.

Figure 7A:
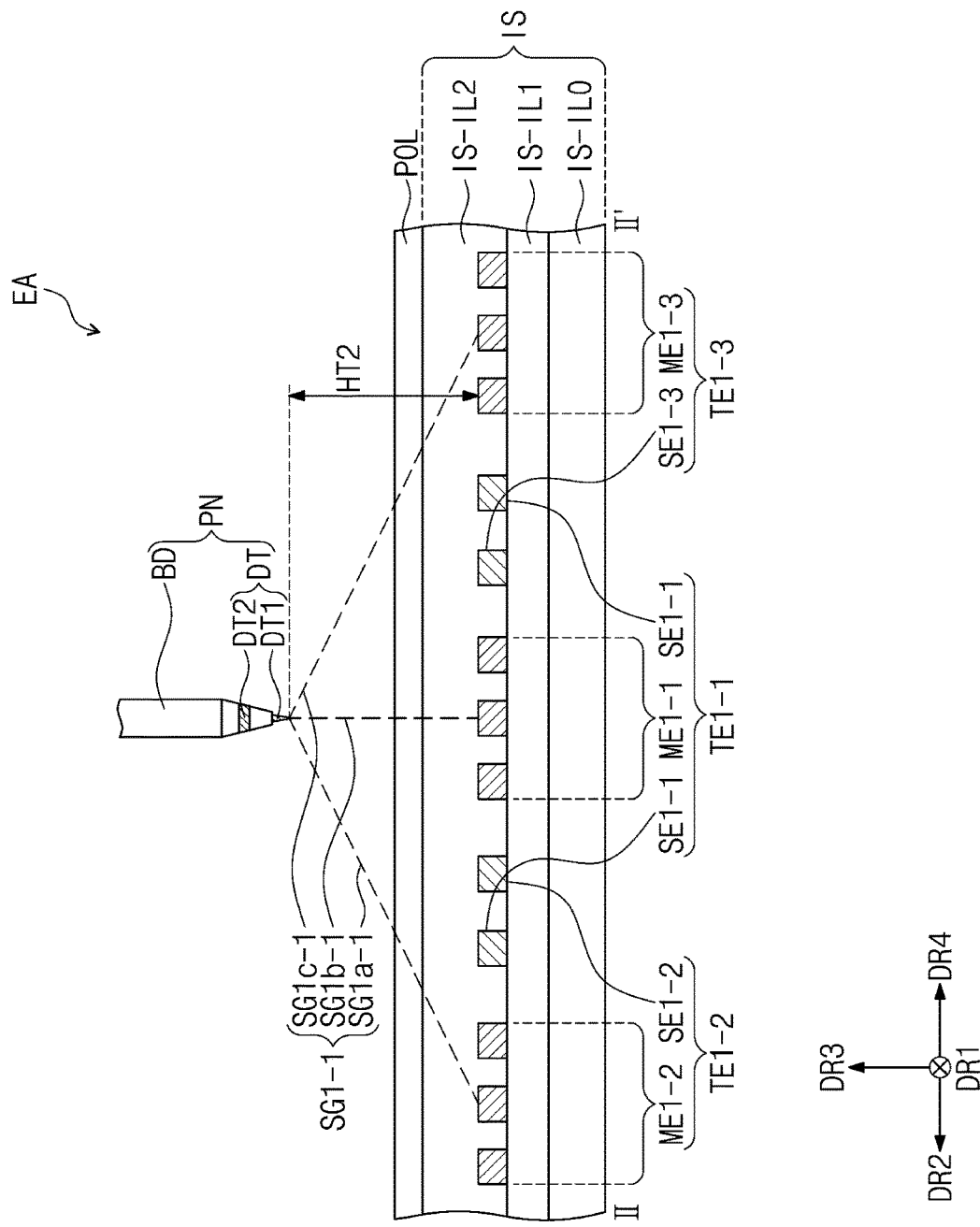
FIG. 7A is a sectional view taken along the line II-II' of FIG. 4 to illustrate a portion of an electronic device according to some embodiments of the present disclosure.
Figure 7B:
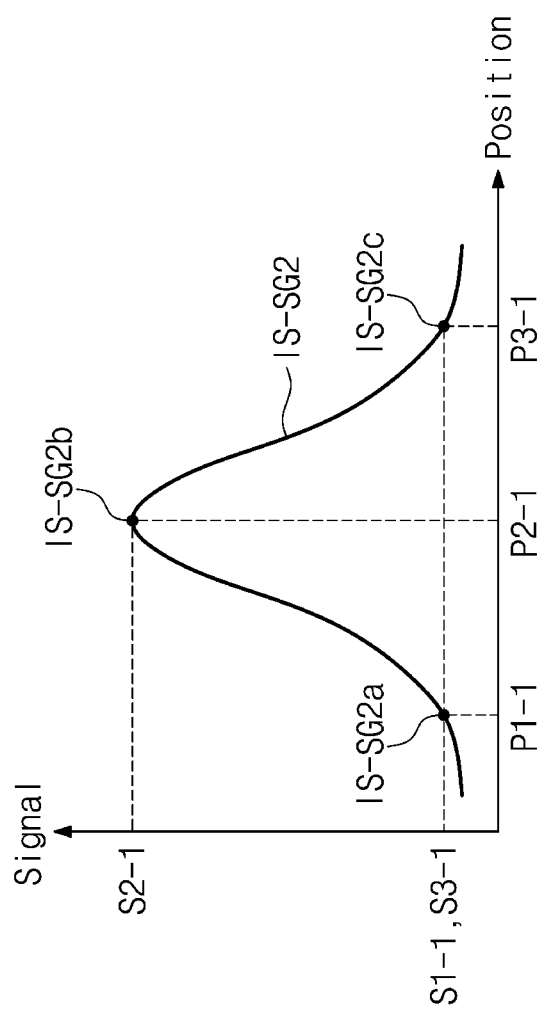
FIG. 7B is a graph showing a signal of an input sensor receiving a first signal, according to some embodiments of the present disclosure.

FIG. 7A is a sectional view taken along the line II-II' of FIG. 4 to illustrate a portion of an electronic device according to some embodiments of the present disclosure, and FIG. 7B is a graph showing a signal of an input sensor receiving a first signal, according to some embodiments of the present disclosure. In the following description of FIG. 7A, an element described with reference to FIG. 6A may be identified by a similar or identical reference number without repeating an overlapping description thereof for the sake of brevity.

Referring to FIGS. 7A and 7B, the active pen PN may perform a hovering motion on the electronic device EA. The first pen electrode DT1 may transmit a first signal SG1-1. The first signal SG1-1 may include a first sub-signal SG1a-1, a second sub-signal SG1b-1, and a third sub-signal SG1c-1. The first sub-signal SG1a-1, the second sub-signal SG1b-1, and the third sub-signal SG1c-1 may be classified by an emission angle of the first signal SG1-1. The sensing electrodes TE1 and TE2 (e.g., see FIG. 4) may be used to sense the first signal SG1-1, and the control unit CT (e.g., see FIG. 4) may calculate a sensing signal IS-SG2 from the first signal SG1-1.

The second main electrode ME1-2 may be used to sense the first sub-signal SG1a-1. The first main electrode ME1-1 may be used to sense the second sub-signal SG1b-1. Another second main electrode ME1-3 may be used to sense the third sub-signal SG1c-1.

The control unit CT (e.g., see FIG. 4) may calculate a first intensity S1-1 of a first sensing signal IS-SG2a at a position P1-1 of the second electrode TE1-2 from the first sub-signal SG1a-1 sensed by the second main electrode ME1-2. The control unit CT (e.g., see FIG. 4) may calculate a second intensity S2-1 of a second sensing signal IS-SG2b at a position P2-1 of the first electrode TE1 from the second sub-signal SG1b-1 sensed by the first main electrode ME1-1. The control unit CT (e.g., see FIG. 4) may calculate a third intensity S3-1 of a third sensing signal IS-SG2c at a position P3-1 of another second electrode TE1 from the third sub-signal SG1c-1 sensed by the other second main electrode ME1-3.

The control unit CT (e.g., see FIG. 4) may combine the first sensing signal IS-SG2a, the second sensing signal IS-SG2b, and the third sensing signal IS-SG2c to form the sensing signal IS-SG2. The control unit CT (e.g., see FIG. 4) may calculate position coordinates of the active pen PN with improved accuracy, from the sensing signal IS-SG2.

According to some embodiments of the present disclosure, even when the first signal SG1-1 caused by the hovering motion of the active pen PN is not normally detected by the second subsidiary electrodes SE1-2 and SE1-3, the first signal SG1-1 may be detected by the second main electrodes ME1-2 and ME1-3. Thus, it may be possible to increase a detectable height of the active pen PN which is in the hovering motion on the electronic device EA. Furthermore, in the control unit CT (e.g., see FIG. 4), the position coordinates of the active pen PN may be corrected using the first sensing signal IS-SG2a and the third sensing signal IS-SG2c. Accordingly, it may be possible to improve the accuracy in position coordinates of the active pen PN relative to the electronic device EA by using the first signal SG1-1. This may make it possible to provide the electronic device EA with improved sensing reliability.

Figure 8A:
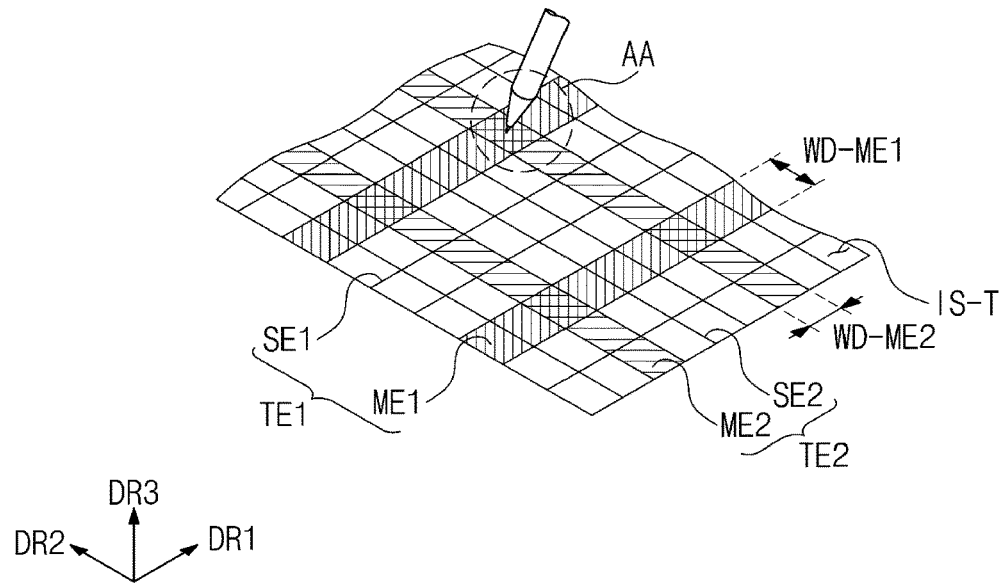
FIG. 8A is a perspective view illustrating a portion of an electronic device according to some embodiments of the present disclosure.
Figure 8B:
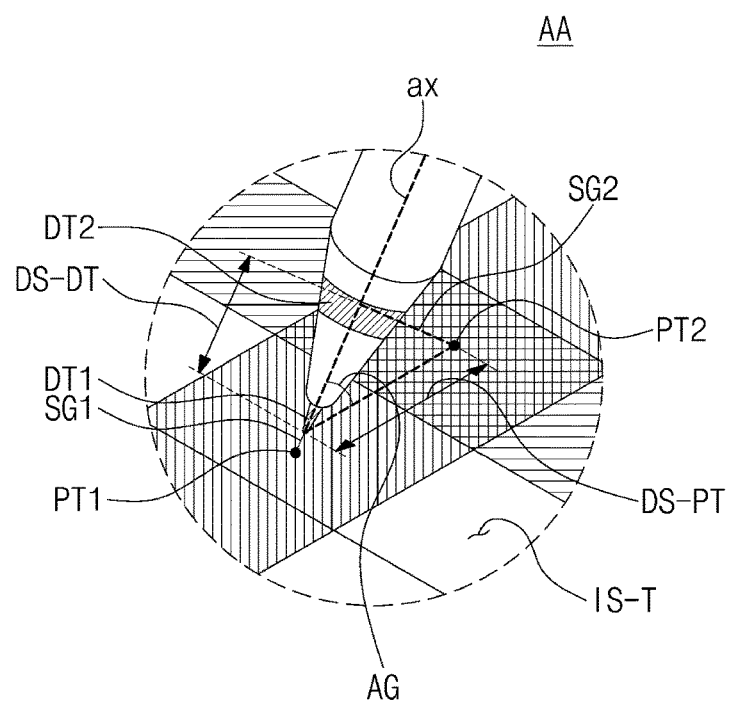
FIG. 8B is an enlarged view illustrating a region AA' of an electronic device according to some embodiments of the present disclosure.

FIG. 8A is a perspective view illustrating a portion of an electronic device according to some embodiments of the present disclosure, and FIG. 8B is an enlarged view illustrating a region AA' of FIG. 8A according to some embodiments of the present disclosure.

Referring to FIGS. 4, 8A, and 8B, the sensing portion DT may include the first pen electrode DT1 and the second pen electrode DT2. The second pen electrode DT2 may be located on a side surface of the body portion BD. The second pen electrode DT2 may transmit a second signal SG2 in a direction that is perpendicular to a center axis AX of the active pen PN. The second signal SG2 may have a second frequency that is different from the first frequency of the first signal SG1. The second frequency may range from about 210 kHz to about 250 kHz. In some embodiments, the second frequency may be about 230 kHz.

The first and second sensing electrodes TE1 and TE2 may be used to sense the first signal SG1, and the control unit CT (e.g., see FIG. 4) may calculate coordinates of a first point PT1 from the first signal SG1. Also, the first and second sensing electrodes TE1 and TE2 may be used to sense the second signal SG2, and the control unit CT (e.g., see FIG. 4) may calculate coordinates of a second point PT2 from the second signal SG2. The control unit CT may calculate a distance DS-PT between the first point PT1 and the second point PT2.

The control unit CT may calculate an angle AG of the active pen PN relative to a top surface IS-T of the input sensor IS based on the geometrical configuration of the active pen PN and the input sensor IS. For example, a previously-recoded distance DS-DT between the first and second pen electrodes DT1 and DT2 and the distance DS-PT between the first and second points PT1 and PT2 may be used for this calculation. Here, because the active pen PN is sufficiently close to the input sensor IS, a distance between the first pen electrode DT1 and the top surface IS-T of the input sensor IS can be neglected, and thus, it may be possible to regard a geometrical element, which is defined by the first and second pen electrodes DT1 and DT2 and the first and second points PT1 and PT2, as a triangle.

According to some embodiments of the present disclosure, the second subsidiary electrode SE1-2 may be located between the first main electrode ME1-1 and the first subsidiary electrode SE1-1. The second subsidiary electrode SE1-2 may be located adjacent to the first main electrode ME1-1. The second subsidiary electrode SE1-2 may be used to sense the second signal SG2. The control unit CT may correct the coordinates of the second point PT2, which are used to calculate the angle AG of the active pen PN relative to the top surface IS-T of the input sensor IS, using a signal sensed by the second subsidiary electrode SE1-2. Thus, it may be possible to improve the accuracy in position coordinates of the active pen PN relative to the electronic device EA by using the second signal SG2. This may make it possible to provide the electronic device EA (e.g., see FIG. 1) with improved sensing reliability.

The main electrode ME1 of each of the first sensing electrodes TE1 may have a width WD-ME1 that is substantially uniform. The main electrode ME2 of each of the second sensing electrodes TE2 may have a width WD-ME2 that is substantially uniform.

In the case where a width of each of the main electrodes ME1 and ME2 is not uniform, a value associated with the second signal SG2 sensed by each of the sensing electrodes TE1 and TE2 may be changed due to the variation in the width. This may lead to an error in detecting the second signal SG2 and in calculating the angle AG of the active pen PN relative to the top surface IS-T of the input sensor IS. By contrast, according to some embodiments of the present disclosure, because each of the main electrodes ME1 and ME2 has a uniform width, it may be possible to improve the reliability of a value associated with the second signal SG2 detected by the sensing electrodes TE1 and TE2. It may be possible to accurately calculate the angle AG of the active pen PN relative to the top surface IS-T of the input sensor IS. This may make it possible to provide the electronic device EA (e.g., see FIG. 1) with improved reliability.

Figure 9:
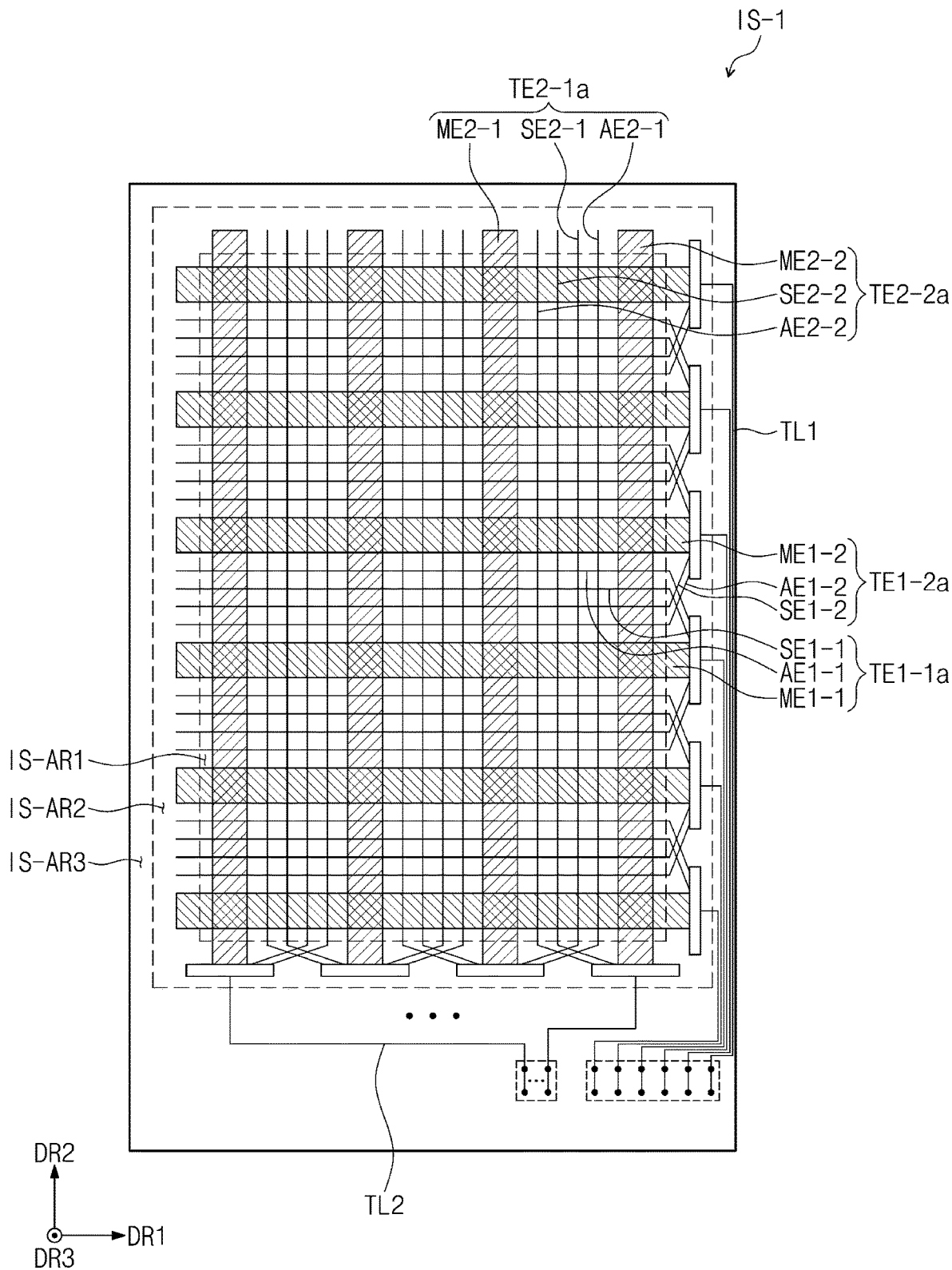
FIG. 9 is a plan view illustrating an input sensor according to some embodiments of the present disclosure.

FIG. 9 is a plan view illustrating an input sensor according to some embodiments of the present disclosure. In the following description of FIG. 9, an element described with reference to FIG. 4 may be identified by a similar or identical reference number without repeating an overlapping description thereof for the sake of brevity.

Referring to FIG. 9, a first electrode TE1-1a may include the first main electrode ME1-1, the first subsidiary electrode SE1-1, and a first auxiliary electrode AE1-1. The first auxiliary electrode AE1-1 may extend in the first direction DR1. A second electrode TE1-2a, which is one of the first sensing electrodes adjacent to the first electrode TE1-1a, may include the second main electrode ME1-2, the second subsidiary electrode SE1-2, and a second auxiliary electrode AE1-2. The second auxiliary electrode AE1-2 may extend in the first direction DR1.

The first auxiliary electrode AE1-1 may be spaced apart from the first main electrode ME1-1 with the first subsidiary electrode SE1-1 interposed therebetween. In the first region IS-AR1, the first subsidiary electrode SE1-1 and the first auxiliary electrode AE1-1 may be located between the second main electrode ME1-2 and the second subsidiary electrode SE1-2.

The second auxiliary electrode AE1-2 may be spaced apart from the second main electrode ME1-2 with the second subsidiary electrode SE1-2 interposed therebetween. In the first region IS-AR1, the second subsidiary electrode SE1-2 and the second auxiliary electrode AE1-2 may be located between the first main electrode ME1-1 and the first subsidiary electrode SE1-1.

When viewed in a plan view, the first auxiliary electrode AE1-1 and the second auxiliary electrode AE1-2 may cross each other in the second region IS-AR2.

A third electrode TE2-1a may include the third main electrode ME2-1, the third subsidiary electrode SE2-1, and a third auxiliary electrode AE2-1. The third auxiliary electrode AE2-1 may extend in the second direction DR2. A fourth electrode TE2-2a, which is one of the second sensing electrodes adjacent to the third electrode TE2-1a, may include the fourth main electrode ME2-2, the fourth subsidiary electrode SE2-2, and a fourth auxiliary electrode AE2-2. The fourth auxiliary electrode AE2-2 may extend in the second direction DR2.

The third auxiliary electrode AE2-1 may be spaced apart from the third main electrode ME2-1, with the third subsidiary electrode SE2-1 interposed therebetween. In the first region IS-AR1, the third subsidiary electrode SE2-1 and the third auxiliary electrode AE2-1 may be located between the fourth main electrode ME2-2 and the fourth subsidiary electrode SE2-2.

The fourth auxiliary electrode AE2-2 may be spaced apart from the fourth main electrode ME2-2 with the fourth subsidiary electrode SE2-2 interposed therebetween. In the first region IS-AR1, the fourth subsidiary electrode SE2-2 and the fourth auxiliary electrode AE2-2 may be located between the third main electrode ME2-1 and the third subsidiary electrode SE2-1.

When viewed in a plan view, the third auxiliary electrode AE2-1 and the fourth auxiliary electrode AE2-2 may cross each other in the second region IS-AR2.

In some embodiments, the second auxiliary electrode AE1-2 may be located adjacent to the first main electrode ME1-1. The second auxiliary electrode AE1-2 may be used to sense the first signal SG1 (e.g., see FIG. 6A). The control unit CT (e.g., see FIG. 4) may correct position coordinates of the active pen PN (e.g., see FIG. 6A) using a signal sensed by the second auxiliary electrode AE1-2. Referring to FIG. 6A, it may be possible to improve the accuracy in position coordinates of the active pen PN relative to the electronic device EA by using the first signal SG1. This may make it possible to provide the electronic device EA (e.g., see FIG. 6A) with improved sensing reliability. Although the above description was given on the basis of the second auxiliary electrode AE1-2, the present disclosure is not limited thereto, and other auxiliary electrodes AE1-1, AE2-1, and AE2-2 may be also configured to have the same effect as the second auxiliary electrode AE1-2.

Figure 10:
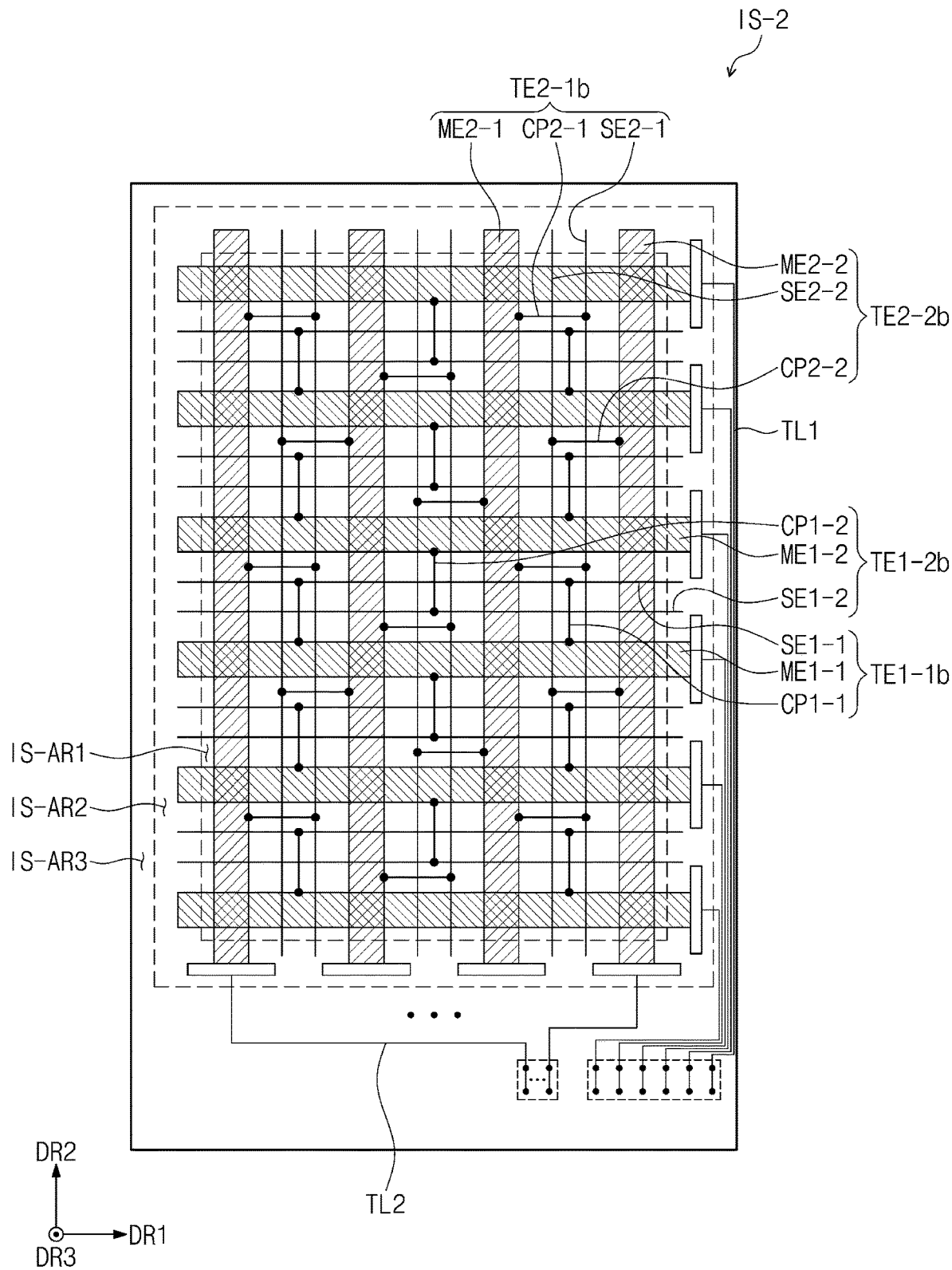
FIG. 10 is a plan view illustrating an input sensor according to some embodiments of the present disclosure.

FIG. 10 is a plan view illustrating an input sensor according to some embodiments of the present disclosure. In the following description of FIG. 10, an element described with reference to FIG. 4 may be identified by a similar or identical reference number without repeating an overlapping description thereof for the sake of brevity.

Referring to FIG. 10, a first electrode TE1-1$b$ may include the first main electrode ME1-1, the first subsidiary electrode SE1-1, and at least one first connection pattern CP1-1. The at least one first connection pattern CP1-1 may connect the first main electrode ME1-1 and the first subsidiary electrode SE1-1 to each other in the first region IS-AR1.

A second electrode TE1-2$b$, which is one of the first sensing electrodes adjacent to the first electrode TE1-1$b$, may include the second main electrode ME1-2, the second subsidiary electrode SE1-2, and at least one second connection pattern CP1-2. The at least one second connection pattern CP1-2 may connect the second main electrode ME1-2 and the second subsidiary electrode SE1-2 to each other in the first region IS-AR1.

FIG. 10 illustrates an example, in which two first connection patterns CP1-1 and one second connection patterns CP1-2 are provided, but the number of each of the first connection pattern CP1-1 and the second connection pattern CP1-2 is not limited thereto.

When viewed in a plan view, the first connection pattern CP1-1 may cross the second subsidiary electrode SE1-2 in an electrically disconnected manner. The second connection pattern CP1-2 may cross the first subsidiary electrode SE1-1 in an electrically disconnected manner.

A third electrode TE2-1$b$ may include the third main electrode ME2-1, the third subsidiary electrode SE2-1, and at least one third connection pattern CP2-1. The at least one third connection pattern CP2-1 may connect the third main electrode ME2-1 and the third subsidiary electrode SE2-1 to each other in the first region IS-AR1.

A fourth electrode TE2-2$b$, which is one of the second sensing electrodes adjacent to the third electrode TE2-1$b$, may include the fourth main electrode ME2-2, the fourth subsidiary electrode SE2-2, and at least one fourth connection pattern CP2-2. The at least one fourth connection pattern CP2-2 may connect the fourth main electrode ME2-2 and the fourth subsidiary electrode SE2-2 to each other in the first region IS-AR1.

FIG. 10 illustrates an example, in which three third connection patterns CP2-1 and two fourth connection patterns CP2-2 are provided, but the number of each of the third and fourth connection patterns CP2-1 and CP2-2 is not limited thereto.

When viewed in a plan view, the third connection pattern CP2-1 may cross the fourth subsidiary electrode SE2-2 in an electrically disconnected manner. The fourth connection pattern CP2-2 may cross the third subsidiary electrode SE2-1 in an electrically disconnected manner.

According to some embodiments of the present disclosure, the at least one first connection pattern CP1-1 may connect the first main electrode ME1-1 and the first subsidiary electrode SE1-1 to each other in the first region IS-AR1. The at least one first connection pattern CP1-1 may reduce an area of the second region IS-AR2. Accordingly, it may be possible to provide the electronic device EA (e.g., see FIG. 1) with a reduced bezel area. Although the above description was given on the basis of the first connection pattern CP1-1, the present disclosure is not limited thereto and other connection patterns CP1-2, CP2-1, and CP2-2 may be also configured to have the same effect as the first connection pattern CP1-1.

According to some embodiments of the present disclosure, a plurality of the first connection patterns CP1-1 may be connected to each of the first main electrode ME1-1 and the first subsidiary electrode SE1-1. In this case, the resistance of the first electrode TE1-1$b$ may be decreased. Furthermore, it may be possible to suppress a RC delay issue associated with the first electrode TE1-1$b$. That is, it may be possible to reduce or prevent delay of a signal, which is delivered through the first electrode TE1-1$b$, thereby increasing a transmission speed of the signal. Thus, it may be possible to provide the electronic device EA (e.g., see FIG. 1) with improved reliability. Although the above description was given on the basis of the first connection pattern CP1-1, the present disclosure is not limited thereto, and other connection patterns CP1-2, CP2-1, and CP2-2 may be also configured to have the same effect as the first connection pattern CP1-1.

According to some embodiments of the present disclosure, the second subsidiary electrode SE1-2 may be located adjacent to the first main electrode ME1-1. The second subsidiary electrode SE1-2 may be used to sense the first signal SG1 (e.g., see FIG. 6A). The control unit CT (e.g., see FIG. 4) may correct position coordinates of the active pen PN (e.g., see FIG. 6A) using a signal sensed by the second subsidiary electrode SE1-2. Referring to FIG. 6A, it may be possible to improve the accuracy in position coordinates of the active pen PN relative to the electronic device EA by using the first signal SG1. This may make it possible to provide the electronic device EA (e.g., see FIG. 6A) with improved sensing reliability.

According to some embodiments of the present disclosure, each of sensing electrodes may include a main electrode and a subsidiary electrode. There may be a subsidiary electrode of a neighboring sensing electrode between the main and subsidiary electrodes of each sensing electrode. A control unit may sense a signal, which is provided from an active pen, through the main electrode of each sensing electrode and the subsidiary electrode of the neighboring sensing electrode. In the control unit, position coordinates of the active pen may be corrected using signals, which are input through the main electrode of each sensing electrode and the subsidiary electrode of the neighboring sensing electrode. Accordingly, it may be possible to improve the accuracy of the coordinates of the active pen, which is used to input a signal, relative to the electronic device. Thus, it may be possible to provide an electronic device with improved sensing reliability.

While embodiments of the present disclosure have been particularly shown and described, it will be understood by one of ordinary skill in the art that variations in form and detail may be made therein without departing from the spirit and scope of the attached claims, with functional equivalents thereof to be included therein.

What is claimed is:

1. An electronic device comprising:
   a display panel; and
   an input sensor, in which a first region, a second region enclosing the first region, and a third region enclosing the second region are defined, on the display panel and comprising a plurality of sensing electrodes comprising:
      a first electrode comprising a first main electrode and a first subsidiary electrode; and
      a second electrode adjacent the first electrode, and comprising a second main electrode and a second subsidiary electrode between the first main electrode and the first subsidiary electrode in the first region,
   wherein the first subsidiary electrode and the second subsidiary electrode cross each other in the second region in a plan view to thereby overlap in a thickness direction of the display panel.

2. The electronic device of claim 1, wherein the display panel comprises an active region and a peripheral region adjacent thereto,
   wherein the first region and the second region overlap the active region, and
   wherein the third region overlaps the peripheral region.

3. The electronic device of claim 1, wherein the display panel comprises an active region and a peripheral region, which are defined in the display panel to be adjacent to each other,
   wherein the first region overlaps the active region, and
   wherein the second region and the third region overlap the peripheral region.

4. The electronic device of claim 1, wherein the input sensor further comprises a plurality of sensing lines in the third region that are electrically and respectively connected to the plurality of sensing electrodes, and
   wherein the plurality of sensing lines comprise a first line electrically connected to the first main electrode and to the first subsidiary electrode, and a second line electrically connected to the second main electrode and the second subsidiary electrode.

5. The electronic device of claim 1, wherein the plurality of sensing electrodes further comprise a third electrode and a fourth electrode, which are adjacent to each other,
   wherein the first electrode and the second electrode extend in a first direction,
   wherein the third electrode and the fourth electrode extend in a second direction crossing the first direction,
   wherein the third electrode comprises a third main electrode and a third subsidiary electrode,
   wherein the fourth electrode comprises a fourth main electrode and a fourth subsidiary electrode, and
   wherein, in the second region, the fourth subsidiary electrode is between the third main electrode and the third subsidiary electrode.

6. The electronic device of claim 1, wherein a width of the first main electrode is larger than a width of the first subsidiary electrode.

7. The electronic device of claim 1, wherein the first subsidiary electrode comprises two first subsidiary electrodes, and
   wherein the two first subsidiary electrodes are spaced apart from each other with the first main electrode therebetween.

8. The electronic device of claim 1, wherein the first electrode further comprises a first auxiliary electrode that is spaced apart from the first main electrode with the first subsidiary electrode therebetween,
   wherein the second electrode further comprises a second auxiliary electrode spaced apart from the second main electrode with the second subsidiary electrode therebetween,
   wherein, in the first region, the first subsidiary electrode and the first auxiliary electrode are between the second main electrode and the second subsidiary electrode, and
   wherein the first auxiliary electrode and the second auxiliary electrode cross each other in the second region, in a plan view.

9. The electronic device of claim 1, wherein the first electrode further comprises at least one connection pattern in the first region that connects the first main electrode to the first subsidiary electrode, and that crosses the second subsidiary electrode, in a plan view.

10. The electronic device of claim 1, wherein, in the first region, each of the first main electrode, the first subsidiary electrode, the second main electrode, and the second subsidiary electrode extend in a first direction, and
    wherein the first main electrode, the second subsidiary electrode, the first subsidiary electrode, and the second main electrode are sequentially located in a second direction crossing the first direction.

11. An electronic device, comprising:
    a display panel, in which an active region and a peripheral region are defined; and
    an input sensor on the display panel to sense a first signal caused by an active pen, comprising a plurality of first sensing electrodes extending in a first direction and a plurality of second sensing electrodes extending in a second direction crossing the first direction, and in which first, second, and third regions are defined, the second region enclosing the first region, and the third region enclosing the second region,
    wherein the plurality of first sensing electrodes comprise a first electrode comprising a first main electrode and a first subsidiary electrode, and a second electrode adjacent to the first electrode and comprising a second main electrode and a second subsidiary electrode,
    wherein, in the first region, the first main electrode, the second subsidiary electrode, the first subsidiary electrode, and the second main electrode are sequentially located in the second direction, and
    wherein the first subsidiary electrode and the second subsidiary electrode cross each other in the second region in a plan view to thereby overlap in a thickness direction of the display panel.

12. The electronic device of claim 11, wherein the input sensor is configured to sense a second signal, which is caused by the active pen and is different from the first signal, and wherein the electronic device further comprises a control unit that is configured to calculate an angle of the active pen relative to a top surface of the input sensor based on the first signal and the second signal.

13. The electronic device of claim 11, wherein the input sensor is configured to be operated in an electrostatic capacitance manner in a first mode, and wherein the input sensor is configured to be operated in a manner of sensing an electrostatic signal in a second mode, the first signal being recognized in the second mode.

14. The electronic device of claim 11, wherein a width of the first main electrode is larger than a width of the first subsidiary electrode, and wherein a width of the second main electrode is larger than a width of the second subsidiary electrode.

15. The electronic device of claim 11, wherein the second region overlaps the active region.

16. The electronic device of claim 11, wherein the second region overlaps the peripheral region.

17. The electronic device of claim 11, wherein the first electrode further comprises a first auxiliary electrode, which is spaced apart from the first main electrode with the first subsidiary electrode therebetween, wherein the second electrode further comprises a second auxiliary electrode, which is spaced apart from the second main electrode with the second subsidiary electrode therebetween, and wherein, in the first region, the first auxiliary electrode is between the second main electrode and the first subsidiary electrode, and the second auxiliary electrode is between the first main electrode and the second subsidiary electrode.

18. The electronic device of claim 11, wherein the first electrode comprises connection patterns in the first region to connect the first main electrode to the first subsidiary electrode, and wherein the connection patterns cross the second subsidiary electrode, in a plan view.

* * * * *